(12) United States Patent
Huang

(10) Patent No.: US 11,302,277 B2
(45) Date of Patent: Apr. 12, 2022

(54) SHIFT REGISTER UNIT AND DRIVING METHOD THEREOF, GATE DRIVING CIRCUIT AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventor: Fei Huang, Beijing (CN)

(73) Assignees: Ordos YuanSheng Optoelectronics Co., LTD., Ordos (CN); BOE Technology Group Co., LTD., Beijing (CN)

(*) Notice: Subject to any disclaimer, the term of this patent is extended or adjusted under 35 U.S.C. 154(b) by 439 days.

(21) Appl. No.: 16/345,354

(22) PCT Filed: Aug. 21, 2018

(86) PCT No.: PCT/CN2018/101500
§ 371 (c)(1),
(2) Date: Apr. 26, 2019

(87) PCT Pub. No.: WO2019/080619
PCT Pub. Date: May 2, 2019

(65) Prior Publication Data
US 2021/0335252 A1    Oct. 28, 2021

(30) Foreign Application Priority Data
Oct. 26, 2017    (CN) .......................... 201711022194.5

(51) Int. Cl.
*G09G 3/3266*    (2016.01)
*G09G 3/36*    (2006.01)
*G11C 19/28*    (2006.01)

(52) U.S. Cl.
CPC ......... *G09G 3/3677* (2013.01); *G09G 3/3266* (2013.01); *G11C 19/285* (2013.01); *G11C 19/287* (2013.01); *G09G 2310/0286* (2013.01)

(58) Field of Classification Search
CPC ............... G09G 3/3258; G09G 3/3266; G09G 2300/0814; G09G 2310/0281;
(Continued)

(56) References Cited

U.S. PATENT DOCUMENTS

2002/0167026 A1* 11/2002 Azami ................... G11C 19/28
257/200
2004/0150610 A1* 8/2004 Zebedee ................ G11C 19/28
345/100

(Continued)

FOREIGN PATENT DOCUMENTS

CN    104700806 A    6/2015
CN    106782285 A    5/2017
(Continued)

OTHER PUBLICATIONS

International Search Report (including English translation) and Written Opinion of PCT/CN2018/101500, dated Nov. 21, 2018.

*Primary Examiner* — Michael J Eurice
(74) *Attorney, Agent, or Firm* — Fay Sharpe LLP

(57) ABSTRACT

A shift register unit and a driving method thereof, a gate driving circuit and a display apparatus are provided. The shift register unit comprises: an input circuit, a transmission circuit and an output control circuit; wherein the transmission circuit is coupled to a first node, a second node, a clock signal terminal and a first power source terminal, respectively, and is configured to control an electric potential of the second node under the control of the first node, the clock signal terminal and the first power source terminal, and the output control circuit is configured to control an electric potential of the output signal terminal under the control of
(Continued)

the second node. The electric potential of the output signal from the output signal terminal in the shift register unit can be controlled by adopting one clock signal terminal, which effectively reduces the power consumption of the shift register unit.

18 Claims, 6 Drawing Sheets

(58) Field of Classification Search
CPC ..... G09G 2310/0286; G09G 2310/061; G09G 2310/08; G06F 3/04166
See application file for complete search history.

(56) References Cited

U.S. PATENT DOCUMENTS

| | | | |
|---|---|---|---|
| 2008/0174589 A1* | 7/2008 | Nagao | H03K 19/096 345/211 |
| 2010/0182306 A1* | 7/2010 | Kimura | G09G 3/3677 345/213 |
| 2017/0031477 A1* | 2/2017 | Jamshidi Roudbari | G09G 3/3266 |
| 2017/0032752 A1 | 2/2017 | Huang et al. | |
| 2017/0039973 A1 | 2/2017 | Huang | |
| 2018/0061348 A1* | 3/2018 | Zhao | G11C 19/28 |
| 2018/0254091 A1 | 9/2018 | Zhang et al. | |
| 2019/0012974 A1* | 1/2019 | Miyanaga | G09G 3/3648 |

FOREIGN PATENT DOCUMENTS

| | | |
|---|---|---|
| CN | 107610737 A | 1/2018 |
| CN | 207319701 U | 5/2018 |

* cited by examiner

| | |
|---|---|
| During an input phase, the electric potential of the input signal input by the input signal terminal IN is a first electric potential, and the electric potential of the clock signal input by the clock signal terminal CK is a second electric potential, the input circuit 10 controls the electric potential of the first node P1 to be a second electric potential, the transmission circuit 20 controls the electric potential of the second node P2 to be a first electric potential under the control of the first node P1 and the clock signal CK, and the output control circuit 30 controls the electric potential of the output signal terminal OUT to be a second electric potential under the control of the second node P2 | 501 |
| During an output phase, the electric potential of the input signal is a second electric potential, and the electric potential of the clock signal terminal CK is a first electric potential, the input circuit 10 controls the electric potential of the first node P1 to be a second electric potential, the transmission circuit 20 controls the electric potential of the second node P2 to be a second electric potential under the control of the first node P1 and the clock signal terminal CK, and the output control circuit 30 controls the electric potential of the output signal terminal OUT to be a first electric potential under the control of the second node P2 | 502 |
| During a first reset phase, the electric potential of the input signal is a second electric potential, the input circuit 10 controls the electric potential of the first node P1 to be a first electric potential under the control of the input signal and the second node P2, the transmission circuit 10 controls the electric potential of the second node P2 to be a first electric potential under the control of the first node P1, and the output control circuit 30 controls the electric potential of the output signal terminal OUT to be a second electric potential under the control of the second node P2 | 503 |

FIG. 5

During an input phase, the electric potential of the input signal input by the input signal terminal IN is a first electric potential, and the electric potential of the clock signal input by the clock signal terminal CK is a second electric potential, the input circuit 10 controls the electric potential of the first node P1 to be a second electric potential, the transmission circuit 20 controls the electric potential of the second node P2 to be a first electric potential under the control of the first node P1 and the clock signal CK, and the output control circuit 30 controls the electric potential of the output signal terminal OUT to be a second electric potential under the control of the second node P2 — 501

During an output phase, the electric potential of the input signal is a second electric potential, and the electric potential of the clock signal terminal CK is a first electric potential, the input circuit 10 controls the electric potential of the first node P1 to be a second electric potential, the transmission circuit 20 controls the electric potential of the second node P2 to be a second electric potential under the control of the first node P1 and the clock signal terminal CK, and the output control circuit 30 controls the electric potential of the output signal terminal OUT to be a first electric potential under the control of the second node P2 — 502

During a first reset phase, the electric potential of the input signal is a second electric potential, the input circuit 10 controls the electric potential of the first node P1 to be a first electric potential under the control of the input signal and the second node P2, the transmission circuit 10 controls the electric potential of the second node P2 to be a first electric potential under the control of the first node P1, and the output control circuit 30 controls the electric potential of the output signal terminal OUT to be a second electric potential under the control of the second node P2 — 503

During a second reset phase, the electric potential of the reset signal input by the reset signal terminal EN is a first electric potential, the reset circuit 40 controls the electric potential of the first node P1 to be a first electric potential, the transmission circuit 20 controls the electric potential of the second node P2 to be a first electric potential under the control of the first node P1, and the output control circuit 30 controls the electric potential of the output signal terminal OUT to be a second electric potential under the control of the second node P2 — 504

FIG. 6

SHIFT REGISTER UNIT AND DRIVING METHOD THEREOF, GATE DRIVING CIRCUIT AND DISPLAY APPARATUS

This disclosure is a 371 of PCT Patent Application Serial No. PCT/CN2018/101500, filed on Aug. 21, 2018, which claims priority to Chinese Patent Application No. 201711022194.5, filed with the National Intellectual Property Administration of P.R.C. on Oct. 26, 2017 and entitled "SHIFT REGISTER UNIT AND DRIVING METHOD THEREOF, GATE DRIVING CIRCUIT AND DISPLAY APPARATUS", the entire contents of which are incorporated herein by reference.

TECHNICAL FIELD

The present disclosure relates to a shift register unit and a driving method thereof, a gate driving circuit and a display apparatus.

BACKGROUND

When displaying images, a display apparatus needs to scan pixel units by using a shift register (i.e., gate driving circuit). The shift register includes a plurality of shift register units and each shift register unit corresponds to a row of pixel units. The rows of pixel units in the display panel are scanned and driven row by row by the plurality of shift register units to display images.

SUMMARY

The present disclosure provides a shift register unit and a driving method thereof, a gate driving circuit and a display apparatus. The technical solutions are as follows:

In a first aspect, there is provided a shift register unit, comprising: an input circuit, a transmission circuit and an output control circuit;

wherein the input circuit is coupled to an input signal terminal, a first control signal terminal, a second control signal terminal, a first node and a second node, respectively, and is configured to control an electric potential of the first node under the control of the input signal terminal, the first control signal terminal, the second control signal terminal and the second node;

the transmission circuit is coupled to the first node, the second node, a clock signal terminal and a first power source terminal, respectively, and is configured to control an electric potential of the second node under the control of the first node, the clock signal terminal and the first power source terminal; and the output control circuit is coupled to the second node and an output signal terminal respectively, and is configured to control an electric potential of the output signal terminal under the control of the second node.

Optionally, the input circuit is configured to: control the electric potential of the first node to be a second electric potential when a first control signal output by the first control signal terminal is at a first electric potential, a second control signal output by the second control signal terminal is at a second electric potential, and at least one of an electric potential of an input signal output by the input signal terminal and the electric potential of the second node is a first electric potential, and, control the electric potential of the first node to be a first electric potential when the first control signal output by the first control signal terminal is at a first electric potential, the second control signal output by the second control signal terminal is at a second electric potential, and both of the electric potential of the input signal and the electric potential of the second node are second electric potentials;

the transmission circuit is configured to: invert a first power source signal output by the first power source terminal and output the inverted first power source signal to the second node when the electric potential of the first node is a first electric potential, and, invert a clock signal output by the clock signal terminal and output the inverted clock signal to the second node when the electric potential of the first node is a second electric potential;

the output control circuit is configured to: control the electric potential of the output signal terminal to be a second electric potential when the electric potential of the second node is a first electric potential, and, control the electric potential of the output signal terminal to be a first electric potential when the electric potential of the second node is a second electric potential.

Optionally, the input circuit comprises: a first transmission gate and a NOR gate;

wherein a first control terminal of the first transmission gate is coupled to the first control signal terminal, a second control terminal of the first transmission gate is coupled to the second control signal terminal, an input terminal of the first transmission gate is coupled to the input signal terminal, and an output terminal of the first transmission gate is coupled to a first input terminal of the NOR gate; and a second input terminal of the NOR gate is coupled to the second node, and an output terminal of the NOR gate is coupled to the first node.

Optionally, the input signal terminal comprises: a first input signal terminal and a second input signal terminal; and the input circuit comprises: a first transmission gate, a second transmission gate and a NOR gate;

a first control terminal of the first transmission gate is coupled to the first control signal terminal, a second control terminal of the first transmission gate is coupled to the second control signal terminal, an input terminal of the first transmission gate is coupled to the first input signal terminal, and an output terminal of the first transmission gate is coupled to a first input terminal of the NOR gate;

a first control terminal of the second transmission gate is coupled to the second control signal terminal, a second control terminal of the second transmission gate is coupled to the first control signal terminal, an input terminal of the second transmission gate is coupled to the second input signal terminal, and an output terminal of the second transmission gate is coupled to the first input terminal of the NOR gate; and a second input terminal of the NOR gate is coupled to the second node, and an output terminal of the NOR gate is coupled to the first node.

Optionally, the transmission circuit comprises: a first inverter, a third transmission gate, a first transistor and a second inverter;

wherein an input terminal of the first inverter is coupled to the first node, and an output terminal of the first inverter is coupled to a first control terminal of the third transmission gate;

a second control terminal of the third transmission gate is coupled to the first node, an input terminal of the third transmission gate is coupled to the clock signal terminal, and an output terminal of the third transmission gate is coupled to an input terminal of the second inverter;

a gate electrode of the first transistor is coupled to the first node, a first electrode of the first transistor is coupled to the first power source terminal, and a second electrode of the first transistor is coupled to the input terminal of the second inverter, wherein the first electrode and the second electrode are one of a source electrode and a drain electrode, respectively; and an output terminal of the second inverter is coupled to the second node.

Optionally, the output control circuit comprises: a control sub-circuit and an output sub-circuit;

wherein the control sub-circuit is coupled to the second node and a third node, respectively, and is configured to control an electric potential of the third node to be a first electric potential when the electric potential of the second node is a first electric potential, and control the electric potential of the third node to be a second electric potential when the electric potential of the second node is a second electric potential; and the output sub-circuit is coupled to the third node and the output signal terminal, respectively, and is configured to control the electric potential of the output signal terminal to be a second electric potential when the electric potential of the third node is a first electric potential, and control the electric potential of the output signal terminal to be a first electric potential when the electric potential of the third node is a second electric potential.

Optionally, the control sub-circuit comprises: a third inverter, a second transistor, a third transistor, a fourth transistor and a fifth transistor, wherein the second transistor and the third transistor have the same polarity, the fourth transistor and the fifth transistor have the same polarity, and the second transistor and the fourth transistor have opposite polarities;

an input terminal of the third inverter is coupled to the second node, and an output terminal of the third inverter is coupled to a gate electrode of the fifth transistor;

a gate electrode of the second transistor is coupled to the third node, a first electrode of the second transistor is coupled to a second electrode of the fourth transistor, and a second electrode of the second transistor is coupled to a second power source terminal;

a gate electrode of the third transistor is coupled to the second electrode of the fourth transistor, a first electrode of the third transistor is coupled to the second power source terminal, and a second electrode of the third transistor is coupled to the third node;

a gate electrode of the fourth transistor is coupled to the second node, and a first electrode of the fourth transistor is coupled to the first power source terminal; and a first electrode of the fifth transistor is coupled to the third node, and a second electrode of the fifth transistor is coupled to the first power source terminal; wherein, the first electrode and the second electrode are one of a source electrode and a drain electrode, respectively.

Optionally, the second transistor and the third transistor are P-type transistors, and the fourth transistor and the fifth transistor are N-type transistors.

Optionally, the control sub-circuit comprises: a third inverter and a fourth transmission gate;

wherein an input terminal of the third inverter is coupled to the second node, and an output terminal of the third inverter is coupled to a second control terminal of the fourth transmission gate; and a first control terminal of the fourth transmission gate is coupled to the second node, an input terminal of the fourth transmission gate is coupled to the second node, and an output terminal of the fourth transmission gate is coupled to the third node.

Optionally, the output sub-circuit is further coupled to the second power source terminal and the first power source terminal, respectively, and the output sub-circuit comprises: a sixth transistor, a seventh transistor, an eighth transistor, a ninth transistor, a tenth transistor, an eleventh transistor, a twelfth transistor and a thirteenth transistor, wherein the sixth transistor, the eighth transistor and the eleventh transistor have the same polarity, the seventh transistor, the ninth transistor, the tenth transistor, the twelfth transistor and the thirteenth transistor have the same polarity, and the sixth transistor and the seventh transistor have opposite polarities;

a gate electrode of the sixth transistor is coupled to the third node, a first electrode of the sixth transistor is coupled to a second power source terminal, and a second electrode of the sixth transistor is coupled to a fourth node;

a gate electrode of the seventh transistor is coupled to the third node, a first electrode of the seventh transistor is coupled to the first power source terminal, and a second electrode of the seventh transistor is coupled to the fourth node;

a gate electrode of the eighth transistor is coupled to the third node, a first electrode of the eighth transistor is coupled to the second power source terminal, and a second electrode of the eighth transistor is coupled to the output signal terminal;

a gate electrode of the ninth transistor is coupled to the third node, a first electrode of the ninth transistor is coupled to a second electrode of the tenth transistor, and a second electrode of the ninth transistor is coupled to the output signal terminal;

a gate electrode of the tenth transistor is coupled to a second electrode of the eleventh transistor and a second electrode of the twelfth transistor, respectively, and a first electrode of the tenth transistor is coupled to the first power source terminal;

a gate electrode of the eleventh transistor is coupled to the fourth node, and a first electrode of the eleventh transistor is coupled to the second power source terminal;

a gate electrode of the twelfth transistor is coupled to the fourth node, and a first electrode of the twelfth transistor is coupled to a second electrode of the thirteenth transistor; and a gate electrode of the thirteenth transistor is coupled to the output signal terminal, and a first electrode of the thirteenth transistor is coupled to the first power source terminal; wherein, the first electrode and the second electrode are one of a source electrode and a drain electrode, respectively.

Optionally, the output sub-circuit comprises: a fourth inverter;

wherein an input terminal of the fourth inverter is coupled to the third node, and an output terminal of the fourth inverter is coupled to the output signal terminal.

Optionally, the shift register unit further comprises: a reset circuit;

wherein the reset circuit is coupled to a reset signal terminal, a second power source terminal and the first node, respectively, and is configured to control the electric potential of the first node under the control of the reset signal terminal and the second power source terminal.

Optionally, the reset circuit comprises: a fourteenth transistor;

wherein a gate electrode of the fourteenth transistor is coupled to the reset signal terminal, a first electrode of the fourteenth transistor is coupled to the second power source terminal, and a second electrode of the fourteenth transistor is coupled to the first node; wherein, the first electrode and the second electrode are one of a source electrode and a drain electrode, respectively.

In another aspect, there is provided a driving method for a shift register, for driving the shift register unit described in the above aspect, wherein the shift register unit comprises: an input circuit, a transmission circuit and an output control circuit; wherein the input circuit is coupled to an input signal terminal, a first control signal terminal, a second control signal terminal, a first node and a second node, respectively, the transmission circuit is coupled to the first node, the second node, a clock signal terminal and a first power source terminal, respectively, and the output control circuit is coupled to the second node and an output signal terminal respectively; the driving method comprises:

an input phase, during which an electric potential of an input signal input by the input signal terminal is a first electric potential, and an electric potential of a clock signal input by the clock signal terminal is a second electric potential, controlling, by the input circuit, an electric potential of the first node to be a second electric potential, controlling, by the transmission circuit, an electric potential of the second node to be a first electric potential under the control of the first node and the clock signal, and controlling, by the output control circuit, an electric potential of the output signal terminal to be a second electric potential under the control of the second node;

an output phase, during which the electric potential of the input signal is a second electric potential, and the electric potential of the clock signal is a first electric potential, controlling, by the input circuit, an electric potential of the first node to be a second electric potential, controlling, by the transmission circuit, an electric potential of the second node to be a second electric potential under the control of the first node and the clock signal, and controlling, by the output control circuit, an electric potential of the output signal terminal to be a first electric potential under the control of the second node; and, a first reset phase, during which the electric potential of the input signal is a second electric potential, controlling, by the input circuit, an electric potential of the first node to be a first electric potential under the control of the input signal and the second node, controlling, by the transmission circuit, an electric potential of the second node to be a first electric potential under the control of the first node, and controlling, by the output control circuit, an electric potential of the output signal terminal to be a second electric potential under the control of the second node.

Optionally, the output control circuit comprises: a control sub-circuit and an output sub-circuit;

during the input phase and the first reset phase, the electric potential of the second node is a first electric potential, the control sub-circuit controls the electric potential of a third node to be a first electric potential under the control of the second node, and the output sub-circuit controls the electric potential of the output signal terminal to be a second electric potential under the control of the third node; and during the output phase, the electric potential of the second node is a second electric potential, the control sub-circuit controls the electric potential of the third node to be a second electric potential under the control of the second node, and the output sub-circuit controls the electric potential of the output signal terminal to be a first electric potential under the control of the third node.

Optionally, the transmission circuit comprises: a first inverter, a third transmission gate, a first transistor, and a second inverter;

during the input phase, the electric potential of the first node is a second electric potential, the electric potential of the clock signal is a second electric potential, the first transistor is turned off, the first inverter controls an electric potential of a first control terminal of the third transmission gate to be a first electric potential, the third transmission gate is turned on, the clock signal terminal outputs a clock signal at a second electric potential to an input terminal of the second inverter, and the second inverter controls the electric potential of the second node to be a first electric potential;

during the output phase, the electric potential of the first node is a second electric potential, the electric potential of the clock signal is a first electric potential, the first transistor is turned off, the first inverter controls the electric potential of the first control terminal of the third transmission gate to be a first electric potential, the third transmission gate is turned on, the clock signal terminal outputs a clock signal at a first electric potential to the input terminal of the second inverter, and the second inverter controls the electric potential of the second node to be a second electric potential; and during the first reset phase, the electric potential of the first node is a first electric potential, the first transistor is turned on, the first inverter controls the electric potential of the first control terminal of the third transmission gate to be a second electric potential, the third transmission gate is turned off, the first transistor outputs a second power source signal at a second electric potential to the input terminal of the second inverter, and the second inverter controls the electric potential of the second node to be a first electric potential.

Optionally, the shift register unit further comprises: a reset circuit; the driving method further comprises:

a second reset phase, during which an electric potential of a reset signal input by a reset signal terminal is a first electric potential, controlling, by the reset circuit, the electric potential of the first node to be a first electric potential, controlling, by the transmission circuit, the electric potential of the second node to be a first electric potential under the control of the first node, and controlling, by the output control circuit, an electric potential of the output signal terminal to be a second electric potential under the control of the second node.

In yet another aspect, a gate driving circuit is provided, the gate driving circuit comprising: at least two of the cascaded shift registers as described in the above aspect.

In still yet another aspect, a display apparatus is provided, the display apparatus comprising: the gate driving circuit as described in the above aspect.

BRIEF DESCRIPTION OF THE DRAWINGS

FIG. 5 is a flow chart of a driving method for a shift register unit according to an embodiment of the present disclosure;

FIG. 6 is a flow chart of another driving method for a shift register unit according to an embodiment of the present disclosure;

DETAILED DESCRIPTION

Figure 1:
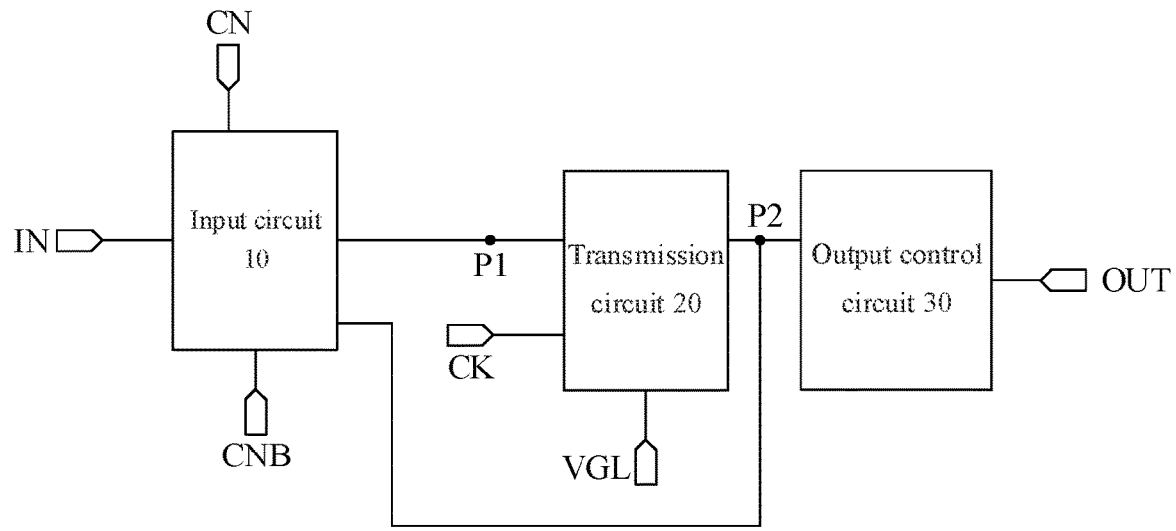
FIG. 1 is a schematic diagram of a structure of a shift register unit according to an embodiment of the present disclosure.

The embodiments of the present disclosure will be described in further detail with reference to the accompanying drawings, to clearly present the principles and advantages of the present disclosure.

Transistors adopted in all the embodiments of the present disclosure may be thin-film transistors or field-effect transistors or other devices having the same features. According to the function in a circuit, the transistors adopted in the embodiments of the present disclosure are generally switch transistors. Since the source electrode and drain electrode of the switch transistor adopted herein are symmetric, the source electrode and drain electrode may be exchanged. In the embodiments of the present disclosure, in order to distinguish the two electrodes of a transistor except the gate electrode, the source electrode is referred to as a first electrode and the drain electrode is referred to as a second electrode. Or, the drain electrode is referred to as a first electrode and the source electrode is referred to as a second electrode. Therefore, the gate electrode of a transistor may also be referred to as a third electrode. According to the form in the drawings, it is specified that a middle terminal of a transistor is the gate electrode, a signal input terminal of a transistor is the source electrode, and a signal output terminal of a transistor is the drain electrode. The switch transistors adopted in the embodiments of the present disclosure may include any of N-type switch transistors and P-type transistors. The N-type switch transistor is turned on when the gate electrode is at a high electric potential, and is turned off when the gate electrode is at a low electric potential. The P-type switch transistor is turned on when the gate electrode is at a low electric potential, and is turned off when the gate electrode is at a high electric potential. Further, in various embodiments of the present disclosure, each of a plurality of signals has a first electric potential and a second electric potential. The first electric potential and the second electric potential only indicate that the potential of the signal has two different state quantities, instead of indicating that the first electric potential or the second electric potential herein in this specification has a specific value.

FIG. 1 is a schematic diagram of a structure of a shift register unit according to an embodiment of the present disclosure. Referring to FIG. 1, the shift register unit may include: an input circuit 10, a transmission circuit 20 and an output control circuit 30.

The input circuit 10 is coupled to an input signal terminal IN, a first control signal terminal CN, a second control signal terminal CNB, a first node P1 and a second node P2, respectively, and is configured to control the electric potential of the first node P1 under the control of the input signal terminal IN, the first control signal terminal CN, the second control signal terminal CNB and the second node P2.

Exemplarily, when a first control signal output by the first control signal terminal CN is at a first electric potential, a second control signal output by the second control signal terminal CNB is at a second electric potential, the input circuit 10 can control the electric potential of the first node P1 to be a second electric potential when the electric potential of a input signal output by the input signal terminal IN is a first electric potential and/or the electric potential of the second node P2 is a first electric potential; and, the input circuit 10 can also control the electric potential of the first node P1 to be a first electric potential when the electric potential of the input signal and the electric potential of the second node P2 are both second electric potentials.

The transmission circuit 20 is coupled to the first node P1, the second node P2, a clock signal terminal CK and a first power source terminal VGL, respectively, and is configured to control the electric potential of the second node P2 under the control of the first node P1, the clock signal terminal CK and the first power source terminal VGL.

Exemplarily, when the electric potential of the first node P1 is a first electric potential, the transmission circuit 20 can control the electric potential of the second node P2 to be a first electric potential under the control of the first power source terminal VGL. When the electric potential of the first node P1 is a second electric potential, the transmission circuit 20 can invert the clock signal output by the clock signal terminal CK and then output the inverted clock signal to the second node P2.

The output control circuit 30 is coupled to the second node P2 and an output signal terminal OUT, respectively, and is configured to control the electric potential of the output signal terminal OUT under the control of the second node P2.

Exemplarily, when the electric potential of the second node P2 is a first electric potential, the output control circuit 30 can control the electric potential of the output signal terminal OUT to be a second electric potential. When the electric potential of the second node P2 is a second electric potential, the output control circuit 30 can control the electric potential of the output signal terminal OUT to be a first electric potential.

In summary, the shift register unit according to the embodiments of the present disclosure includes an input circuit, a reset circuit, a transmission circuit and an output control circuit. The shift register unit can control the output signal from the output signal terminal through a clock signal provided by one clock signal terminal in the transmission circuit. Compared with the shift register unit which adopts two clock signal terminals for control in the related art, the shift register unit in the present disclosure has lower power consumption, simpler structure and smaller occupied area.

Figure 2:
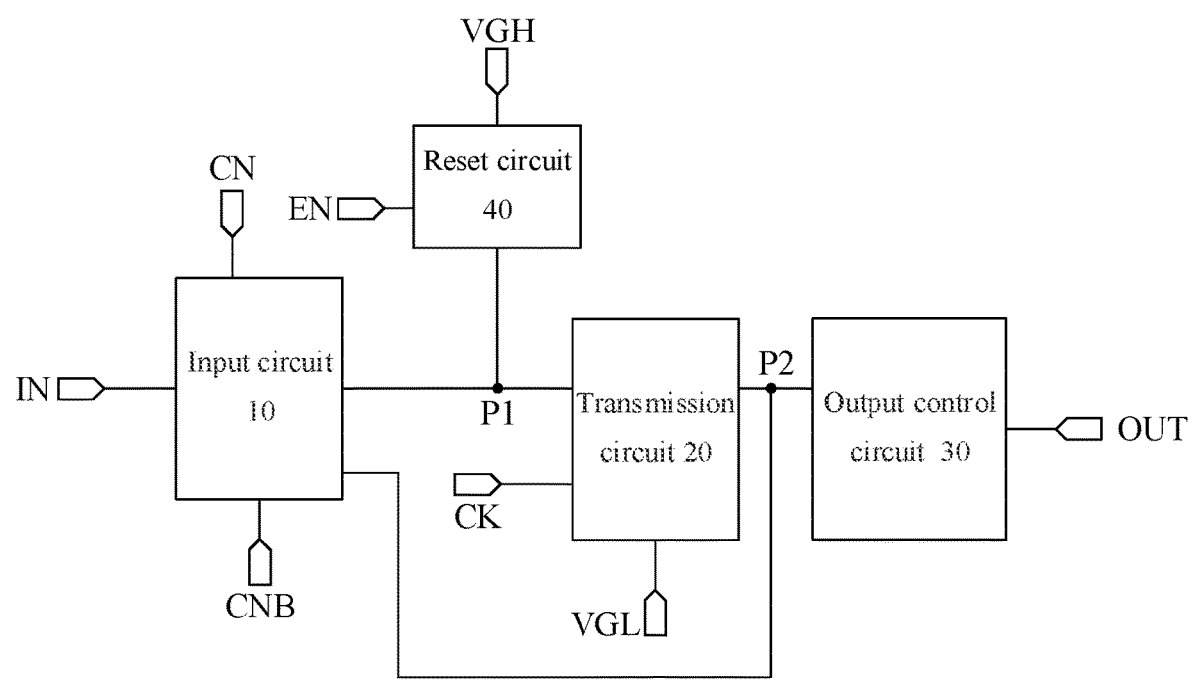
FIG. 2 is a schematic diagram of a structure of another shift register unit according to an embodiment of the present disclosure.

FIG. 2 is a schematic diagram of a structure of another shift register unit according to an embodiment of the present disclosure. As shown in FIG. 2, the shift register unit may include: a reset circuit 40.

The reset circuit 40 is coupled to a reset signal terminal EN, a second power source terminal VGH and the first node P1, respectively, and is configured to control the electric potential of the first node P1 under the control of the reset signal terminal EN and a second power source terminal VGH.

Exemplarily, the reset circuit 40 may output a first power source signal from the second power source terminal VGH to the first node P1 when the electric potential of a reset signal output by the reset signal terminal EN is a first electric potential, wherein the first power source signal is at a first electric potential. The first node P1 can be reset by disposing the reset circuit 40.

Figure 3:
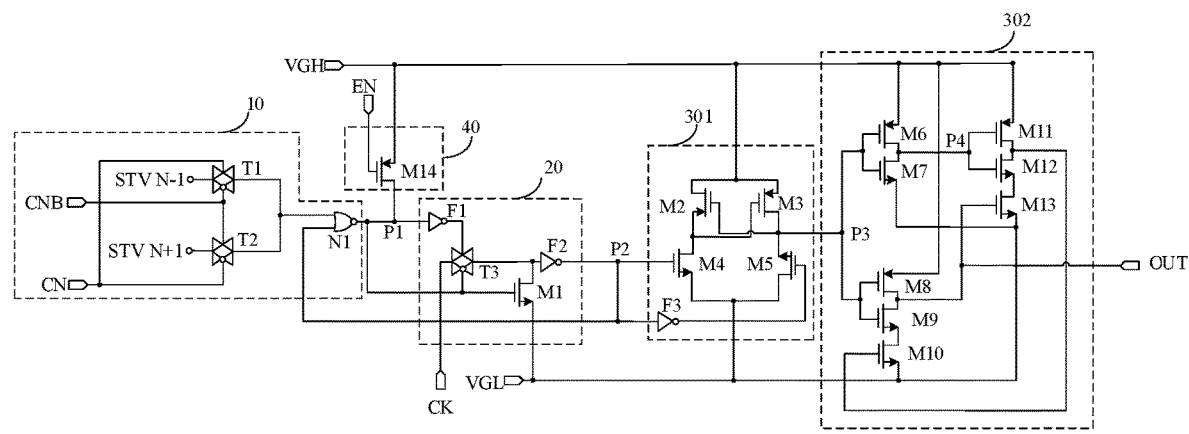
FIG. 3 is a schematic diagram of a structure of yet another shift register unit according to an embodiment of the present disclosure.

FIG. 3 is a schematic diagram of a structure of yet another shift register unit according to an embodiment of the present disclosure. Referring to FIG. 3, the input circuit 10 may include: a first transmission gate T1 and a NOR gate N1.

The first control terminal of the first transmission gate T1 is coupled to the first control signal terminal CN, the second control terminal of the first transmission gate T1 is coupled to the second control signal terminal CNB, the input terminal of the first transmission gate T1 is coupled to the first input signal terminal STV_N−1, and the output terminal of the first transmission gate T1 is coupled to the first input terminal of the NOR gate N1.

The second input terminal of the NOR gate N1 is coupled to the second node P2, and the output terminal of the NOR gate N1 is coupled to the first node P1.

Optionally, referring to FIG. 3, the input signal terminal IN of the input circuit 10 may include: a first input signal terminal STV_N−1 and a second input signal terminal STV_N+1. The input circuit 10 may include: a first transmission gate T1, a second transmission gate T2 and a NOR gate N1.

The first control terminal of the first transmission gate T1 is coupled to the first control signal terminal CN, the second control terminal of the first transmission gate T1 is coupled to the second control signal terminal CNB, the input terminal of the first transmission gate T1 is coupled to the first input signal terminal STV_N−1, and the output terminal of the first transmission gate T1 is coupled to the first input terminal of the NOR gate N1.

The first control terminal of the second transmission gate T2 is coupled to the second control signal terminal CNB, the second control terminal of the second transmission gate T2 is coupled to the first control signal terminal CN, the input terminal of the second transmission gate T2 is coupled to the second input signal terminal STV_N+1, and the output terminal of the second transmission gate T2 is coupled to the first input terminal of the NOR gate N1.

The second input terminal of the NOR gate N1 is coupled to the second node P2, the output terminal of the NOR gate N1 is coupled to the first node N1.

The first input signal terminal STV_N−1 may be coupled to the output terminal OUT of the shift register unit of the previous level, and the second input signal terminal STV_N+1 may be coupled to the output terminal OUT of the shift register unit of the next level.

Therefore, when the electric potential of the first control signal provided by the first control signal terminal CN is a first electric potential, and the electric potential of the second control signal provided by the second control signal terminal CNB is a second electric potential, the first transmission gate T1 is turned on, and the second transmission gate T2 is turned off. The input circuit 10 of each level of shift register unit starts working under the drive of the first input signal terminal STV_N−1 (i.e., the output terminal the shift register unit of the previous level). Therefore, the forward scanning of each row of pixel units in the display apparatus is achieved.

When the electric potential of the first control signal provided by the first control signal terminal CN is a second electric potential, and the electric potential of the second control signal provided by the second control signal terminal CNB is a first electric potential, the first transmission gate T1 is turned off, and the second transmission gate T2 is turned on. The input circuit 10 of each level of shift register unit starts working under the drive of the second input signal terminal STV_N+1 (i.e., the output terminal of the shift register unit of the next level). Therefore, the reverse scanning of each row of pixel units in the display apparatus is achieved.

Optionally, referring to FIG. 3, the transmission circuit 20 may include: a first inverter F1, a third transmission gate T3, a first transistor M1 and a second inverter F2.

The input terminal of the first inverter F1 is coupled to the first node P1, and the output terminal of the first inverter F1 is coupled to the first control terminal of the third transmission gate T3.

The second control terminal of the third transmission gate T3 is coupled to the first node P1, the input terminal of the third transmission gate T3 is coupled to the clock signal terminal CK, and the output terminal of the third transmission gate T3 is coupled to the input terminal of the second inverter F2.

The gate electrode of the first transistor M1 is coupled to the first node P1, the first electrode of the first transistor M1 is coupled to the first power source terminal VGL, and the second electrode of the first transistor M1 is coupled to the input terminal of the second inverter F2.

The output terminal of the second inverter F2 is coupled to the second node P2.

Optionally, referring to FIG. 3, the output control circuit 30 may include: a control sub-circuit 301 and an output sub-circuit 302.

The control sub-circuit 301 is coupled to the second node P2 and a third node P3, respectively, and is configured to control the electric potential of the third node P3 to be a first electric potential when the electric potential of the second node P2 is a first electric potential, and control the electric potential of the third node P3 to be a second electric potential when the electric potential of the second node P2 is a second electric potential.

The output sub-circuit 302 is coupled to the third node P3 and the output signal terminal OUT, respectively, and is configured to control the electric potential of the output signal terminal OUT to be a second electric potential when the electric potential of the third node P3 is a first electric potential, and control the electric potential of the output signal terminal OUT to be a first electric potential when the electric potential of the third node P3 is a second electric potential.

In an optional implementation of the embodiments of the present disclosure, the control sub-circuit 301 may further be coupled to the second power source terminal VGH and the first power source terminal VGL, respectively. The control sub-circuit 301 can output the first power source signal from the second power source terminal VGH to the third node P3 when the electric potential of the second node P2 is a first electric potential, and output a second power source signal from the first power source terminal VGL to the third node P3 when the electric potential of the second node P2 is a second electric potential. The first power source signal is at a first electric potential, the second power source signal is at a second electric potential, and the first electric potential may be a high electric potential relative to the second electric potential.

Referring to FIG. 3, the control sub-circuit 301 may include: a third inverter F3, a second transistor M2, a third transistor M3, a fourth transistor M4 and a fifth transistor M5. The second transistor M2 and the third transistor M3 have the same polarity, the fourth transistor M4 and the fifth transistor M5 have the same polarity, and the second transistor M2 and the fourth transistor M4 have opposite polarities. For example, the second transistor M2 and the third transistor M3 may be P-type transistors, and the fourth transistor M4 and the fifth transistor M5 may be N-type transistors. Correspondingly, the first electric potential may be a high electric potential relative to the second electric potential.

The input terminal of the third inverter F3 is coupled to the second node P2, and the output terminal of the third inverter F3 is coupled to the gate electrode of the fifth transistor M5.

The gate electrode of the second transistor M2 is coupled to the third node P3, the first electrode of the second transistor M2 is coupled to the second electrode of the fourth transistor M4, and the second electrode of the second transistor M2 is coupled to the second power source terminal VGH.

The gate electrode of the third transistor M3 is coupled to the second electrode of the fourth transistor M4, the first electrode of the third transistor M3 is coupled to the second power source terminal VGH, and the second electrode of the third transistor M3 is coupled to the third node P3.

The gate electrode of the fourth transistor M4 is coupled to the second node P2, and the first electrode of the fourth transistor M4 is coupled to the first power source terminal VGL.

The first electrode of the fifth transistor M5 is coupled to the third node P3, and the second electrode of the fifth transistor M5 is coupled to the first power source terminal VGL.

In this implementation, the control sub-circuit 301 can output the first power source signal from the second power source terminal VGH or the second power source signal from the first power source terminal VGL to the third node P3 under the control of the second node P2. As the electric potentials of the power source signals provided by the second power source terminal VGH and the first power source terminal VGL can be adjusted appropriately, the flexibility of the shift register unit during operation is effectively improved. In addition, the control sub-circuit 301 consists of four transistors, which can improve the driving ability of the control sub-circuit 301, such that the signals output by the control sub-circuit 301 to the third node P3 are more stable.

Figure 4:
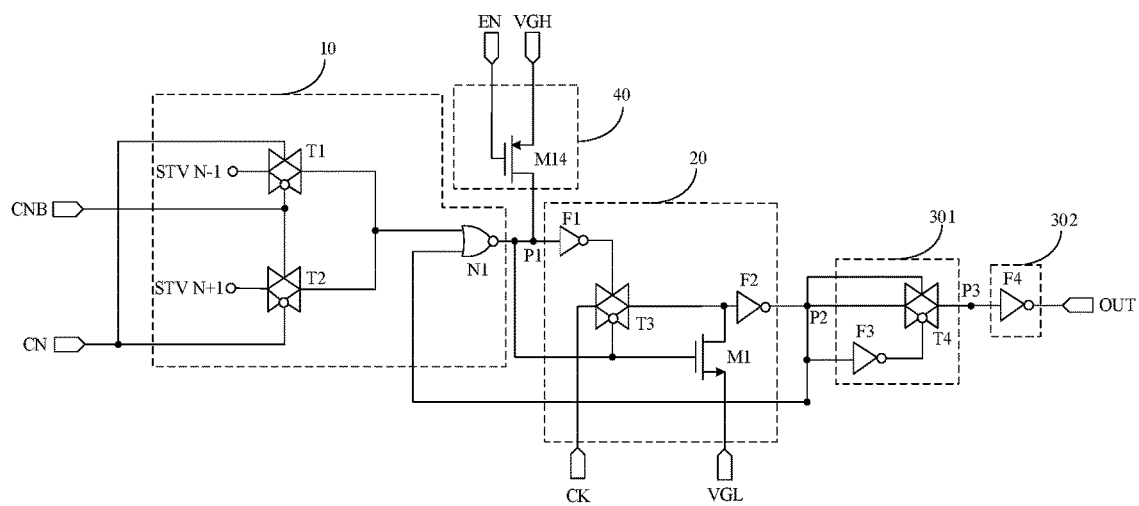
FIG. 4 is a schematic diagram of a structure of still yet another shift register unit according to an embodiment of the present disclosure.

In another optional implementation of the embodiments of the present disclosure, referring to FIG. 4, the control sub-circuit 301 may include: a third inverter F3 and a fourth transmission gate T4.

The input terminal of the third inverter F3 is coupled to the second node P2, and the output terminal of the third inverter F3 is coupled to the second control terminal of the fourth transmission gate T4.

The first control terminal of the fourth transmission gate T4 is coupled to the second node P2, the input terminal of the fourth transmission gate T4 is coupled to the second P2, and the output terminal of the fourth transmission gate T4 is coupled to the third node P3.

In an optional implementation of the embodiments of the present disclosure, the output sub-circuit 302 may further be coupled to the second power source terminal VGH and the first power source terminal VGL, respectively. The output sub-circuit 302 can output the second power source signal to the output signal terminal OUT when the electric potential of the third node P3 is the electric potential of the first power source signal, and output the first power source signal to the output signal terminal OUT when the electric potential of the third node P3 is the electric potential of the second power source signal. The first power source signal is at a first electric potential, the second power source signal is at a second electric potential, and the first electric potential is a high electric potential relative to the second electric potential.

Referring to FIG. 3, the output sub-circuit 302 may include: a sixth transistor M6, a seventh transistor M7, an eighth transistor M8, a ninth transistor M9, a tenth transistor M10, an eleventh transistor M11, a twelfth transistor M12 and a thirteenth transistor M13. The sixth transistor M6, the eighth transistor M8 and the eleventh transistor M11 have the same polarity. The seventh transistor M7, the ninth transistor M9, the tenth transistor M10, twelfth transistor M12 and the thirteenth transistor M13 have the same polarity. The sixth transistor M6 and the seventh transistor M7 have opposite polarities. For example, the seventh transistor M7, the ninth transistor M9, the tenth transistor M10, twelfth transistor M12 and the thirteenth transistor M13 may be N-type transistors, and the sixth transistor M6, the eighth transistor M8 and the eleventh transistor M11 may be P-type transistors.

The gate electrode of the sixth transistor M6 is coupled to the third node P3, the first electrode of the sixth transistor M6 is coupled to the second power source terminal VGH, and the second electrode of the sixth transistor M6 is coupled to a fourth node P4.

The gate electrode of the seventh transistor M7 is coupled to the third node P3, the first electrode of the seventh transistor M7 is coupled to the first power source terminal VGL, and the second electrode of the seventh transistor M7 is coupled to the fourth node P4.

The gate electrode of the eighth transistor M8 is coupled to the third node P3, the first electrode of the eighth transistor M8 is coupled to the second power source terminal VGH, and the second electrode of the eighth transistor M8 is coupled to the output signal terminal OUT.

The gate electrode of the ninth transistor M9 is coupled to the third node P3, the first electrode of the ninth transistor M9 is coupled to the second electrode of the tenth transistor M10, and the second electrode of the ninth transistor M9 is coupled to the output signal terminal OUT.

The gate electrode of the tenth transistor M10 is coupled to the second electrode of the eleventh transistor M11 and the second electrode of the twelfth transistor M12, respectively, and the first electrode of the tenth transistor M10 is coupled to the first power source terminal VGL.

The gate electrode of the eleventh transistor M11 is coupled to the fourth node P4, and the first electrode of the eleventh transistor M11 is coupled to the second power source terminal VGH.

The gate electrode of the twelfth transistor M12 is coupled to the fourth node P4, and the first electrode of the twelfth transistor M12 is coupled to the second electrode of the thirteenth transistor M13.

The gate electrode of the thirteenth transistor M13 is coupled to the output signal terminal OUT, and the first electrode of the thirteenth transistor M13 is coupled to the first power source terminal VGL.

In this implementation, the output sub-circuit 302 can output the first power source signal provided by the second power source terminal VGH or the second power source signal provided by the first power source terminal VGL to the output signal terminal OUT under the control of the third node P3. As the electric potentials of the power source signals provided by the second power source terminal VGH and the first power source terminal VGL can be adjusted appropriately, the flexibility of the shift register unit during operation is effectively improved. In addition, the output sub-circuit 302 consists of eight transistors, which can improve the driving ability of the output sub-circuit 302, such that the signals output by the output sub-circuit 302 to the output signal terminal OUT are more stable.

In another optional implementation of the embodiments of the present disclosure, referring to FIG. 4, the output sub-circuit 302 may include: a fourth inverter F4.

The input terminal of the fourth inverter F4 is coupled to the third node P3, and the output terminal of the fourth inverter F4 is coupled to the output signal terminal OUT.

Optionally, referring to FIG. 3, the reset circuit 40 may include: a fourteenth transistor M14.

The gate electrode of the fourteenth transistor M14 is coupled to the reset signal terminal EN, the first electrode of the fourteenth transistor M14 is coupled to the second power source terminal VGH, and the second electrode of the fourteenth transistor M14 is coupled to the first node P1.

In summary, the shift register unit according to the embodiments of the present disclosure includes an input circuit, a reset circuit, a transmission circuit and an output control circuit. The shift register unit can control the output signal from the output signal terminal a clock signal provided by one clock signal terminal in the transmission circuit. Compared with the shift register unit which adopts two clock signal terminals for control in the related art, the shift register unit in the present disclosure has lower power consumption, simpler structure and smaller occupied area. In addition, the shift register unit in the embodiments of the present disclosure consists of transistors, transmission gates, and inverters. Compared with the shift register unit which adopts the three-state gate in the related art, the shift register unit in the present disclosure can prevent the problem of false output caused by the unstable output state of the three-state gate, thereby improving the output stability of the shift register unit.

FIG. 5 is a flow chart of a driving method for a shift register unit according to an embodiment of the present disclosure. The driving method can be applied to drive the shift register unit described in any of FIG. 1 to FIG. 4. Referring to FIG. 1, the shift register unit may include: an input circuit 10, a reset circuit 20, a transmission circuit 20 and an output control circuit 30. Referring to FIG. 5, the driving method may include the following working processes.

In step 501, during an input phase, the electric potential of the input signal input by the input signal terminal IN is a first electric potential, and the electric potential of the clock signal input by the clock signal terminal CK is a second electric potential, the input circuit 10 controls the electric potential of the first node P1 to be a second electric potential, the transmission circuit 20 controls the electric potential of the second node P2 to be a first electric potential under the control of the first node P1 and the clock signal CK, and the output control circuit 30 controls the electric potential of the output signal terminal OUT to be a second electric potential under the control of the second node P2.

In step 502, during an output phase, the electric potential of the input signal is a second electric potential, and the electric potential of the clock signal terminal CK is a first electric potential, the input circuit 10 controls the electric potential of the first node P1 to be a second electric potential, the transmission circuit 20 controls the electric potential of the second node P2 to be a second electric potential under the control of the first node P1 and the clock signal terminal CK, and the output control circuit 30 controls the electric potential of the output signal terminal OUT to be a first electric potential under the control of the second node P2.

In step 503, during a first reset phase, the electric potential of the input signal is a second electric potential, the input circuit 10 controls the electric potential of the first node P1 to be a first electric potential under the control of the input signal and the second node P2, the transmission circuit 10 controls the electric potential of the second node P2 to be a first electric potential under the control of the first node P1, and the output control circuit 30 controls the electric potential of the output signal terminal OUT to be a second electric potential under the control of the second node P2.

In summary, with the driving method for the shift register unit according to the embodiments of the present disclosure, the output signal from the output signal terminal can be controlled through the clock signal provided by one clock signal terminal in the transmission circuit. Compared with driving method for the shift register unit which adopts two clock signal terminals in the related art, the driving power consumption is relatively low.

FIG. 6 is a flow chart of another driving method for a shift register unit according to an embodiment of the present disclosure. Referring to FIG. 6, the driving method may further include a second reset phase.

In step 504, during a second reset phase, the electric potential of the reset signal input by the reset signal terminal EN is a first electric potential, the reset circuit 40 controls the electric potential of the first node P1 to be a first electric potential, the transmission circuit 20 controls the electric potential of the second node P2 to be a first electric potential under the control of the first node P1, and the output control circuit 30 controls the electric potential of the output signal terminal OUT to be a second electric potential under the control of the second node P2.

Referring to FIG. 3 and FIG. 4, the output control circuit 30 may include: a control sub-circuit 301 and an output sub-circuit 302.

During the input phase, the first reset phase and the second reset phase, the electric potential of the second node P2 is a first electric potential. The control sub-circuit 302 can control the electric potential of the third node P3 to be a first electric potential under the control of the second node P2. The output sub-circuit 302 can control the electric potential of the output signal terminal OUT to be a second electric potential under the control of the third node P3.

During the output phase, the electric potential of the second node P2 is a second electric potential, the control sub-circuit 301 can control the electric potential of the third node P3 to be a second electric potential under the control of the second node P2. The output sub-circuit 302 can control the electric potential of the output signal terminal OUT to be a first electric potential under the control of the third node P3.

Optionally, referring to FIG. 3 and FIG. 4, the transmission circuit 20 may include: a first inverter F1, a third transmission gate T3, a first transistor M1, and a second inverter F2.

During the input phase, the electric potential of the first node P1 is a second electric potential, and the first transistor M1 is turned off, and the electric potential of the clock signal provided by the clock signal terminal CK is a second electric potential, and the first inverter F1 controls the electric potential of the first control terminal of the third transmission gate T3 to be a first electric potential, so that the third transmission gate T3 is turned on. The clock signal terminal CK outputs a clock signal at a second electric potential to the input terminal of the second inverter F2, and the second inverter F2 controls the electric potential of the second node P2 to be a first electric potential.

During the output phase, the electric potential of the first node P1 is a second electric potential, and the first transistor M1 is turned off, and the electric potential of the clock signal provided by the clock signal terminal CK is a first electric potential, and the first inverter F1 controls the electric potential of the first control terminal of the third transmission gate T3 to be a first electric potential, so that the third transmission gate T3 is turned on. The clock signal terminal CK outputs a clock signal at a first electric potential to the input terminal of the second inverter F2, and the second inverter F2 controls the electric potential of the second node P2 to be a second electric potential.

During the first reset phase and the second reset phase, the electric potential of the first node P1 is a first electric potential, and the first transistor M1 is turned on, and the first inverter F1 controls the electric potential of the first control terminal of the third transmission gate T3 to be a second electric potential, and the third transmission gate T3 is turned off. The first transistor M1 outputs a second power source signal at a second electric potential to the input terminal of the second inverter F2, and the second inverter F2 controls the electric potential of the second node P2 to be a first electric potential.

Figure 7:
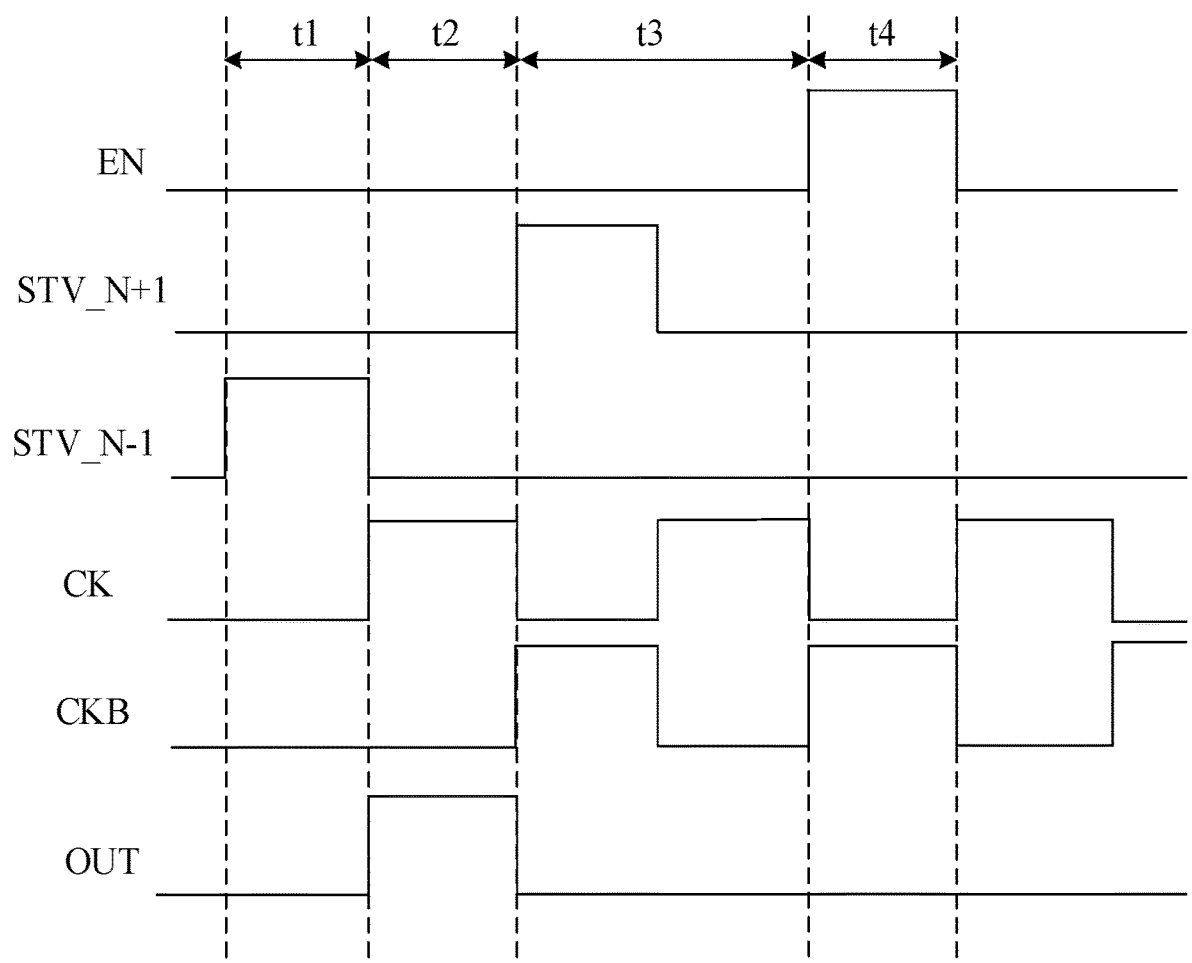
FIG. 7 is a timing sequence diagram during a driving process for a shift register unit according to an embodiment of the present disclosure.

FIG. 7 is a timing sequence diagram of each signal terminal during a driving process for a shift register unit according to an embodiment of the present disclosure. The driving principle of the shift register unit according to the embodiments of the present disclosure is described in detail by taking the shift register unit in FIG. 3 as an example, and by taking an example in which the second transistor M2, the third transistor M3, the sixth transistor M6, the eighth transistor M8 and the eleventh transistor M11 in the shift register unit are P-type transistors, and the first transistor M1, the fourth transistor M4, the fifth transistor M5, the seventh transistor M7, the ninth transistor M9, the tenth transistor M10, the twelfth transistor M12 and the thirteenth transistor M13 and the fourteenth transistor M14 are N-type transistors, and the first control signal output by the first control signal terminal CN is at a first electric potential, the second control signal output by the second control signal terminal CNB is at a second electric potential, and the first electric potential is a high electric potential relative to the second electric potential.

As shown in FIG. 7, during the input phase t1, the electric potential of the input signal output by the first input signal terminal STV_N-1 is a first electric potential, and the electric potential of the clock signal output by the clock signal terminal CK is a second electric potential, and the reset signal provided by the reset signal terminal EN is at a second electric potential, and the fourteenth transistor M14 is turned off. The first control signal is at a first electric potential, and the second control signal is at a second electric potential, and the first transmission gate T1 is turned on, and the second transmission gate T2 is turned off, and the first input signal terminal STV_N-1 outputs the input signal at a first electric potential to the first input terminal of the NOR gate N1. The NOR gate N1 controls the electric potential of the first node P1 to be a second electric potential, so that the first transistor M1 is turned off. The first inverter F1 controls the electric potential of the first control terminal of the third transmission gate T3 to be a first electric potential under the control of the first node P1, and the third transmission gate T3 is turned on. The clock signal terminal CK outputs the clock signal at a second electric potential to the input terminal of the second inverter F2. Therefore, the second inverter F2 can control the electric potential of the second node P2 to be a first electric potential.

Furthermore, the second node P2 can control the fourth transistor M4 to be turned on, and the third inverter F3 inverts the electric potential of the second node P2 and then outputs the inverted electric potential to the gate electrode of the fifth transistor M5, so that the fifth transistor M5 is turned off. The first power source terminal VGL can output the second power source signal to the gate electrode of the third transistor M3 through the fourth transistor M4, and the third transistor M3 is turned on. The second power source terminal VGH outputs the first power source signal at a first electric potential to the third node P3 through the third transistor M3. Furthermore, the third node P3 can control the second transistor M2, the sixth transistor M6, and the eighth transistor M8 to be turned off, and control the seventh transistor M7 and the ninth transistor M9 to be turned on. The first power source terminal VGL outputs the second power source signal at a second electric potential to the fourth node P4 through seventh transistor M7, so that the eleventh transistor M11 is turned on, and the twelfth transistor M12 is turned off. The second power source terminal VGH outputs the first power source signal at a first electric potential to the gate electrode of the tenth transistor M10 through the eleventh transistor M11, so that the tenth transistor M10 is turned on. The first power source terminal VGL further can output the second power source signal at a second electric potential to the output signal terminal OUT through the tenth transistor M10 and the ninth transistor M9. The thirteenth transistor M13 is turned off under the control of the output terminal OUT.

During the output phase t2, the electric potential of the input signal output by the first input signal terminal STV_N-1 is a second electric potential, and the electric potential of the clock signal output by the clock signal terminal CK is a first electric potential, and the reset signal provided by the reset signal terminal EN is at a second electric potential. The fourteenth transistor M14 is turned off, and the first transmission gate T1 is turned on, and the second transmission gate T2 is turned off, and the first input signal terminal STV_N-1 outputs the input signal at a second electric potential to the first input terminal of the NOR gate N1. As the electric potential of the second node P2 is a first electric potential, the NOR gate N1 can control the electric potential of the first node P1 to maintain a second electric potential, so that the first transistor M1 is turned off. The first inverter F1 controls the electric potential of the first control terminal of the third transmission gate T3 to be a first electric potential under the control of the first node P1, and the third transmission gate T3 is turned on. The clock signal terminal CK outputs the clock signal at a first electric potential to the input terminal of the second inverter F2. Therefore, the second inverter F2 can control the electric potential of the second node P2 to be a second electric potential.

Furthermore, the second node P2 can control the fourth transistor M4 to be turned off, and the third inverter F3 inverts the electric potential of the second node P2 and then outputs to the gate electrode of the fifth transistor M5, so that the fifth transistor M5 is turned on. The first power source terminal VGL can output the second power source signal at a second electric potential to third node P3 through the fifth transistor M5. Furthermore, the third node P3 can control the second transistor M2, the sixth transistor M6, and the eighth transistor M8 to be turned on, and control the seventh transistor M7 and the ninth transistor M9 to be turned off. The second power source terminal VGH outputs the first power source signal at a first electric potential to the gate electrode of the third transistor M3 through the second transistor M2, so that the third transistor M3 is turned off. In addition, the second power source terminal VGH can output the first power source signal at a first electric potential to the fourth node P4 through the sixth transistor M6, so that the eleventh transistor M11 is turned off, and the twelfth transistor M12 is turned on. Meanwhile, the second power source terminal VGH can output the first power source signal at a first electric potential to output signal terminal OUT through the eighth transistor M8, and output the first power source signal at a first electric potential to the gate electrode of the thirteenth transistor M13 through the eighth transistor M8, so that the thirteenth transistor M13 is turned on. The first power source terminal VGL outputs the second power source signal at a second electric potential to the tenth transistor M10 through the thirteenth transistor M13 and the twelfth transistor M12, so that the tenth transistor M10 is turned off.

During the first reset phase t3, the input signal output by the first input signal terminal STV_N−1 and the clock signal output by the clock signal terminal CK are at a second electric potential, the first control signal is at a first electric potential, and the second control signal is at a second electric potential. The first transmission gate T1 is turned on, the second transmission gate T2 is turned off, and the first input signal terminal STV_N−1 outputs the input signal at a second electric potential to the first input terminal of the NOR gate N1. As the electric potential of the second node P2 is a second electric potential, the NOR gate N1 can control the electric potential of the first node P1 to be a first electric potential. In this case, the first transistor M1 is turned on, the third transmission gate T3 is turned off, and the first power source terminal VGL outputs the second power source signal at a second electric potential to the input terminal of the second inverter F2 through the first transistor M1. The second inverter F2 can control the electric potential of the second node P2 to be a first electric potential.

Furthermore, the second node P2 can control the fourth transistor M4 to be turned on, and the third inverter F3 inverts the electric potential of the second node P2 and then outputs the inverted electric potential to the gate electrode of the fifth transistor M5, so that the fifth transistor M5 to be turned off. The first power source terminal VGL can output the second power source signal to the gate electrode of the third transistor M3 through the fourth transistor M4, and the third transistor M3 is turned on. The second power source terminal VGH outputs the first power source signal at a first electric potential to the third node P3 through the third transistor M3. Furthermore, the third node P3 can control the second transistor M2, the sixth transistor M6, and the eighth transistor M8 to be turned off, and control the seventh transistor M7 and the ninth transistor M9 to be turned on. The first power source terminal VGL outputs the second power source signal at a second electric potential to the fourth node P4 through seventh transistor M7, so that the eleventh transistor M11 is turned on, and the twelfth transistor M12 is turned off. The second power source terminal VGH outputs the first power source signal at a first electric potential to the gate electrode of the tenth transistor M10 through the eleventh transistor M11, so that the tenth transistor M10 is turned on. The first power source terminal VGL further can output the second power source signal at a second electric potential to the output signal terminal OUT through the tenth transistor M10 and the ninth transistor M9, and the thirteenth transistor M13 is turned off.

It should be noted that the first reset phase t3 can be maintained until the input signal output by the first input signal terminal STV_N−1 jumps to a first electric potential again. During the first reset phase t3, when the second inverter F2 controls the electric potential of the second node P2 to be a first electric potential, the NOR gate N1 can control the electric potential of the first node P1 to be a second electric potential under the control of the second node P2 and the first input signal, so that the first transistor M1 is turned off and the third transmission gate T3 is turned on. As the electric potential of the clock signal output by the clock signal terminal CK is a second electric potential at the moment, the second inverter F2 can continue to control the electric potential of the second node P2 to be a first electric potential. Subsequently, when the electric potential of the clock signal output by the clock signal terminal CK is a first electric potential, the second inverter F2 can control the electric potential of the second node P2 to be a second electric potential. In this case, the NOR gate N1 can control the electric potential of the first node P1 to be a first electric potential again, such that the first transistor M1 is turned on, and the second inverter F2 can adjust the electric potential of the second node P2 to be the first potential again, thereby guaranteeing the electric potential of the output signal terminal OUT maintain a second electric potential.

In the embodiments of the present disclosure, before each frame of image is scanned or after each frame of image is scanned, the shift register unit can also be driven to execute the second reset phase t4. During the second reset phase t4, the electric potential of the reset signal provided by the reset signal terminal EN is a first electric potential, and the fourteenth transistor M14 is turned on, and the second power source terminal VGH can output the first power source signal at a first electric potential to the first node P1 through the fourteenth transistor M14, so as to control the electric potential of the first node P1 to maintain a first electric potential. Correspondingly, the output circuit 20 and the output control circuit 30 can control the electric potential of the output signal terminal OUT to maintain a second electric potential under the control of the first node P1. As the reset signal terminal EN can enable the fourteenth transistor M14 in shift register units of all levels in the gate driving circuit to be turned on, all rows of pixels in the display panel can be controlled to be in a dark state, thereby discharging the display panel is achieved.

Optionally, referring to FIG. 7, when the first control signal provided by the first control signal terminal CN is at a second electric potential, and the second control signal provided by the second control signal terminal CNB is at a first electric potential, the second transmission gate T2 is turned on, and the first transmission gate T1 is turned off. The shift register unit can control the electric potential of the output signal terminal OUT under the control of the second input signal terminal STV_N+1. The driving principle is the same as the above one, which will not be repeated in the embodiment of the present disclosure.

In summary, with the driving method for the shift register unit according to the embodiments of the present disclosure, the output signal from the output signal terminal can be controlled through the clock signal provided by one clock signal terminal in the transmission circuit. Compared with driving method for the shift register unit which adopts two clock signal terminals in the related art, the driving power consumption is relatively low.

Figure 8:
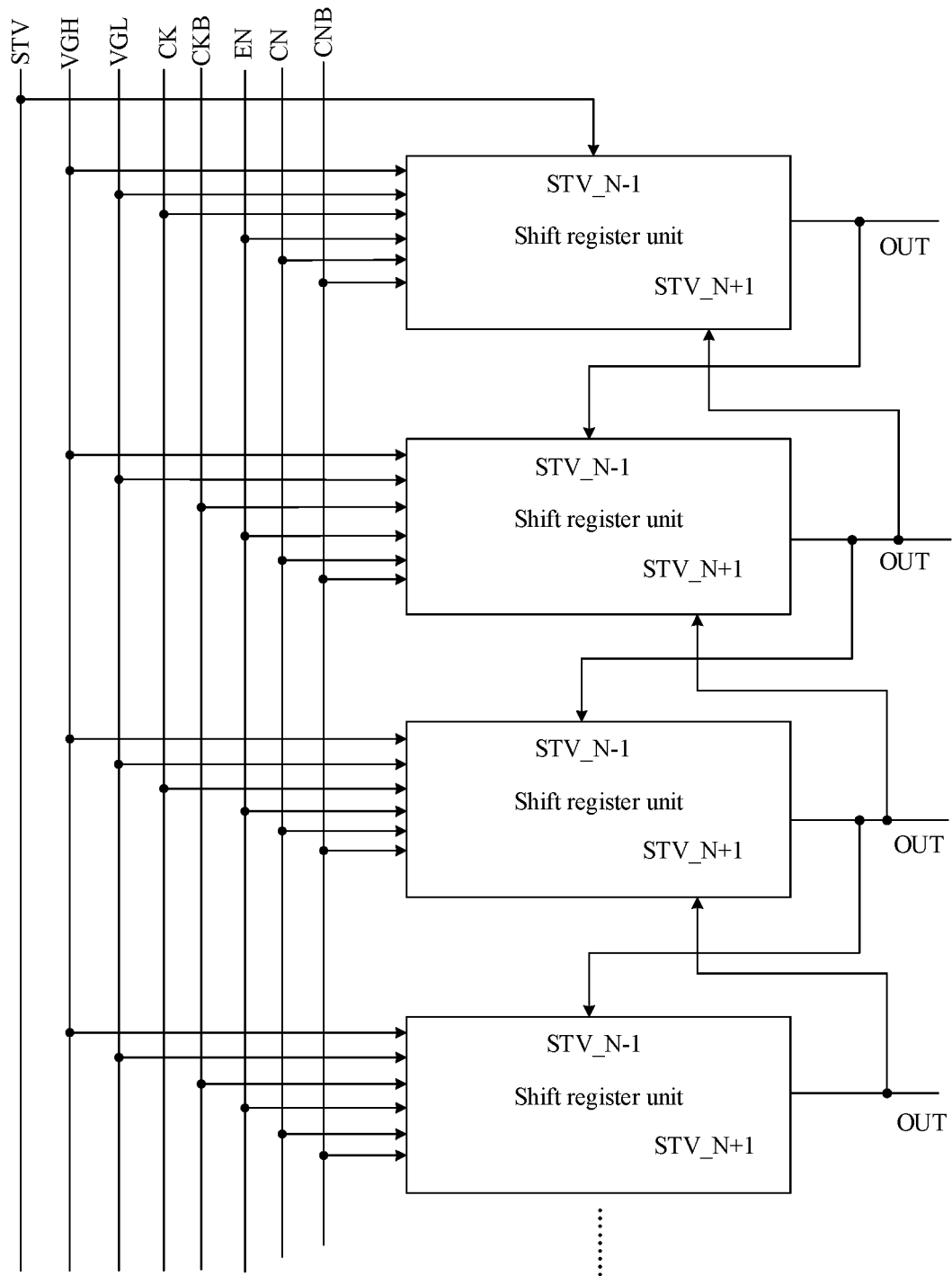
FIG. 8 is a schematic diagram of a structure of a gate driving circuit according to an embodiment of the present disclosure.

FIG. 8 is a schematic diagram of a structure of a gate driving circuit according to an embodiment of the present disclosure. As shown in FIG. 8, the gate driving circuit may include at least two cascaded shift register units, and each shift register unit may be the shift register unit shown in any of FIG. 1 to FIG. 4.

It can be seen from FIG. 8 that the first input signal terminal STV_N−1 of the shift register unit of each level is coupled to the output signal terminal OUT of the shift register unit of the previous level, and the second input signal terminal STV_N+1 of the shift register unit of each level is coupled to the output signal terminal OUT of the shift register unit of the next level. It can further be seen from FIG. 8 that in the gate driving circuit, the first input signal terminal STV_N−1 of the shift register unit of the first level may be coupled to the start signal terminal STV.

By controlling the first control signal terminal CN and the second control signal terminal CNB, the shift register unit of each level in the gate driving circuit can achieve the forward and reverse scanning in the display apparatus.

For example, when the first control signal terminal CN outputs the first control signal at a first electric potential and the second control signal terminal CNB outputs the second control signal at a second electric potential, all levels of shift register units in the gate driving circuit can start to turn on sequentially from the first level of shift register unit, thereby the forward scanning in the display apparatus is achieved. When the first control signal terminal CN outputs the first control signal at a second electric potential and the second control signal terminal CNB outputs the second control signal at a first electric potential, all levels of shift register units in the gate driving circuit can start to turn on sequentially from the last level of shift register unit, thereby the reverse scanning in the display apparatus is achieved.

It should be noted that, referring to FIG. 8, the gate driving circuit may be coupled to two clock signal terminals CK and CKB. In addition, adjacent two levels of shift register units may be coupled to the two clock signal terminals, respectively. For example, in the circuit shown in FIG. 8, the first level of shift register unit is coupled to the clock signal terminal CK, and the second level of shift register unit is coupled to the clock signal terminal CKB.

It can be seen from FIG. 7 that the clock signals output by the two clock signal terminals CK and CKB have the same frequency but different phases.

The embodiments of the present disclosure further provide a display apparatus, which may include the gate driving circuit shown in FIG. 8. The display apparatus may be: any product or part with a display function, such as a liquid crystal panel, an electronic paper, an AMOLED panel, a mobile phone, a tablet, a TV, a display, a laptop computer, a digital phone frame, a GPS, etc.

Technical persons in the art can clearly understand that, for the convenience and conciseness of description, the working processes of the shift register unit and each circuit described above can be made reference to the corresponding process in the method embodiments, which are not repeated herein.

The foregoing descriptions are only optional embodiments of the present disclosure, and are not intended to limit the scope of the present disclosure. Within the spirit and principles of the disclosure, any modifications, equivalent substitutions, improvements, etc., are within the protection scope of the appended claims of the present disclosure.

What is claimed is:

1. A shift register unit, comprising: an input circuit, a transmission circuit and an output control circuit;
  wherein the input circuit is coupled to an input signal terminal, a first control signal terminal, a second control signal terminal, a first node and a second node, respectively, and is configured to control an electric potential of the first node under the control of the input signal terminal, the first control signal terminal, the second control signal terminal and the second node;
  the transmission circuit is coupled to the first node, the second node, a clock signal terminal and a first power source terminal, respectively, and is configured to control an electric potential of the second node under the control of the first node, the clock signal terminal and the first power source terminal; and
  the output control circuit is coupled to the second node and an output signal terminal respectively, and is configured to control an electric potential of the output signal terminal under the control of the second node, and
  wherein the input circuit comprises: a first transmission gate and a NOR gate;
  a first control terminal of the first transmission gate is coupled to the first control signal terminal, a second control terminal of the first transmission gate is coupled to the second control signal terminal, an input terminal of the first transmission gate is coupled to the input signal terminal, and an output terminal of the first transmission gate is coupled to a first input terminal of the NOR gate; and
  a second input terminal of the NOR gate is coupled to the second node, and an output terminal of the NOR gate is coupled to the first node.

2. The shift register unit according to claim 1, wherein the transmission circuit comprises: a first inverter, a third transmission gate, a first transistor and a second inverter;
  wherein an input terminal of the first inverter is coupled to the first node, and an output terminal of the first inverter is coupled to a first control terminal of the third transmission gate;
  a second control terminal of the third transmission gate is coupled to the first node, an input terminal of the third transmission gate is coupled to the clock signal terminal, and an output terminal of the third transmission gate is coupled to an input terminal of the second inverter;
  a gate electrode of the first transistor is coupled to the first node, a first electrode of the first transistor is coupled to the first power source terminal, and a second electrode of the first transistor is coupled to the input terminal of the second inverter, wherein the first electrode and the second electrode are one of a source electrode and a drain electrode, respectively; and
  an output terminal of the second inverter is coupled to the second node.

3. The shift register unit according to claim 1,
  wherein the input circuit is configured to: control the electric potential of the first node to be a second electric potential when a first control signal output by the first control signal terminal is at a first electric potential, a second control signal output by the second control signal terminal is at a second electric potential, and at least one of an electric potential of an input signal output by the input signal terminal and the electric potential of the second node is a first electric potential, and, control the electric potential of the first node to be a first electric potential when the first control signal output by the first control signal terminal is at a first electric potential, the second control signal output by the second control signal terminal is at a second electric potential, and both of the electric potential of the input signal and the electric potential of the second node are second electric potentials;

the transmission circuit is configured to: invert a first power source signal output by the first power source terminal and output the inverted first power source signal to the second node when the electric potential of the first node is a first electric potential, and, invert a clock signal output by the clock signal terminal and output the inverted clock signal to the second node when the electric potential of the first node is a second electric potential;

the output control circuit is configured to: control the electric potential of the output signal terminal to be a second electric potential when the electric potential of the second node is a first electric potential, and, control the electric potential of the output signal terminal to be a first electric potential when the electric potential of the second node is a second electric potential.

4. The shift register unit according to claim 1, wherein the input signal terminal comprises: a first input signal terminal and a second input signal terminal; and the input circuit comprises: a first transmission gate, a second transmission gate and a NOR gate;

wherein a first control terminal of the first transmission gate is coupled to the first control signal terminal, a second control terminal of the first transmission gate is coupled to the second control signal terminal, an input terminal of the first transmission gate is coupled to the first input signal terminal, and an output terminal of the first transmission gate is coupled to a first input terminal of the NOR gate;

a first control terminal of the second transmission gate is coupled to the second control signal terminal, a second control terminal of the second transmission gate is coupled to the first control signal terminal, an input terminal of the second transmission gate is coupled to the second input signal terminal, and an output terminal of the second transmission gate is coupled to the first input terminal of the NOR gate; and a second input terminal of the NOR gate is coupled to the second node, and an output terminal of the NOR gate is coupled to the first node.

5. The shift register unit according to claim 1, further comprising a reset circuit; wherein the input signal terminal comprises: a first input signal terminal and a second input signal terminal; the input circuit comprises: a first transmission gate, a second transmission gate and a NOR gate; the transmission circuit comprises: a first inverter, a third transmission gate, a first transistor and a second inverter; the output control circuit comprises: a third inverter, a second transistor, a third transistor, a fourth transistor, a fifth transistor, a sixth transistor, a seventh transistor, an eighth transistor, a ninth transistor, a tenth transistor, an eleventh transistor, a twelfth transistor and a thirteenth transistor; the reset circuit comprises: a fourteenth transistor; wherein, the second transistor and the third transistor have the same polarity, the fourth transistor and the fifth transistor have the same polarity, and the second transistor and fourth transistor have opposite polarities; the sixth transistor, the eighth transistor and the eleventh transistor have the same polarity, the seventh transistor, the ninth transistor, the tenth transistor, twelfth transistor and the thirteenth transistor have the same polarity, and the sixth transistor and the seventh transistor have opposite polarities;

a first control terminal of the first transmission gate is coupled to the first control signal terminal, a second control terminal of the first transmission gate is coupled to the second control signal terminal, an input terminal of the first transmission gate is coupled to the first input signal terminal, and an output terminal of the first transmission gate is coupled to a first input terminal of the NOR gate;

a first control terminal of the second transmission gate is coupled to the second control signal terminal, a second control terminal of the second transmission gate is coupled to the first control signal terminal, an input terminal of the second transmission gate is coupled to the second input signal terminal, and an output terminal of the second transmission gate is coupled to the first input terminal of the NOR gate;

a second input terminal of the NOR gate is coupled to the second node, an output terminal of the NOR gate is coupled to the first node;

an input terminal of the first inverter is coupled to the first node, and an output terminal of the first inverter is coupled to a first control terminal of the third transmission gate;

a second control terminal of the third transmission gate is coupled to the first node, an input terminal of the third transmission gate is coupled to the clock signal terminal, and an output terminal of the third transmission gate is coupled to an input terminal of the second inverter;

a gate electrode of the first transistor is coupled to the first node, a first electrode of the first transistor is coupled to the first power source terminal, and a second electrode of the first transistor is coupled to the input terminal of the second inverter, an output terminal of the second inverter is coupled to the second node;

an input terminal of the third inverter is coupled to the second node, and an output terminal of the third inverter is coupled to a gate electrode of the fifth transistor;

a gate electrode of the second transistor is coupled to the third node, a first electrode of the second transistor is coupled to a second electrode of the fourth transistor, and a second electrode of the second transistor is coupled to the second power source terminal;

a gate electrode of the third transistor is coupled to the second electrode of the fourth transistor, a first electrode of the third transistor is coupled to the second power source terminal, and a second electrode of the third transistor is coupled to the third node;

a gate electrode of the fourth transistor is coupled to the second node, and a first electrode of the fourth transistor is coupled to the first power source terminal;

a first electrode of the fifth transistor is coupled to the third node, and a second electrode of the fifth transistor is coupled to the first power source terminal;

a gate electrode of the sixth transistor is coupled to the third node, a first electrode of the sixth transistor is coupled to the second power source terminal, and a second electrode of the sixth transistor is coupled to a fourth node;

a gate electrode of the seventh transistor is coupled to the third node, a first electrode of the seventh transistor is coupled to the first power source terminal, and a second electrode of the seventh transistor is coupled to the fourth node;

a gate electrode of the eighth transistor is coupled to the third node, a first electrode of the eighth transistor is coupled to the second power source terminal, and a second electrode of the eighth transistor is coupled to the output signal terminal;

a gate electrode of the ninth transistor is coupled to the third node, a first electrode of the ninth transistor is coupled to a second electrode of the tenth transistor, and a second electrode of the ninth transistor is coupled to the output signal terminal;

a gate electrode of the tenth transistor is coupled to a second electrode of the eleventh transistor and a second electrode of the twelfth transistor, respectively, and a second electrode of the tenth transistor is coupled to the first power source terminal;

a gate electrode of the eleventh transistor is coupled to the fourth node, and a first electrode of the eleventh transistor is coupled to the second power source terminal;

a gate electrode of the twelfth transistor is coupled to the fourth node, and a first electrode of the twelfth transistor is coupled to a second electrode of the thirteenth transistor;

a gate electrode of the thirteenth transistor is coupled to the output signal terminal, and a first electrode of the thirteenth transistor is coupled to the first power source terminal; and, a gate electrode of the fourteenth transistor is coupled to the reset signal terminal, a first electrode of the fourteenth transistor is coupled to the second power source terminal, and a second electrode of the fourteenth transistor is coupled to the first node; wherein, the first electrode and the second electrode are one of a source electrode and a drain electrode, respectively.

6. The shift register unit according to claim 1, further comprising: a reset circuit;

wherein the reset circuit is coupled to a reset signal terminal, a second power source terminal and the first node, respectively, and is configured to control the electric potential of the first node under the control of the reset signal terminal and the second power source terminal.

7. The shift register unit according to claim 6, wherein the reset circuit comprises: a fourteenth transistor;

wherein a gate electrode of the fourteenth transistor is coupled to the reset signal terminal, a first electrode of the fourteenth transistor is coupled to the second power source terminal, and a second electrode of the fourteenth transistor is coupled to the first node; wherein, the first electrode and the second electrode are one of a source electrode and a drain electrode, respectively.

8. The shift register unit according to claim 1, wherein the output control circuit comprises: a control sub-circuit and an output sub-circuit;

wherein the control sub-circuit is coupled to the second node and a third node, respectively, and is configured to control an electric potential of the third node to be a first electric potential when the electric potential of the second node is a first electric potential, and control the electric potential of the third node to be a second electric potential when the electric potential of the second node is a second electric potential; and the output sub-circuit is coupled to the third node and the output signal terminal, respectively, and is configured to control the electric potential of the output signal terminal to be a second electric potential when the electric potential of the third node is a first electric potential, and control the electric potential of the output signal terminal to be a first electric potential when the electric potential of the third node is a second electric potential.

9. The shift register unit according to claim 8, wherein the output sub-circuit comprises: a sixth transistor, a seventh transistor, an eighth transistor, a ninth transistor, a tenth transistor, an eleventh transistor, a twelfth transistor and a thirteenth transistor, wherein the sixth transistor, the eighth transistor and the eleventh transistor have the same polarity, the seventh transistor, the ninth transistor, the tenth transistor, the twelfth transistor and the thirteenth transistor have the same polarity, and the sixth transistor and the seventh transistor have opposite polarities;

a gate electrode of the sixth transistor is coupled to the third node, a first electrode of the sixth transistor is coupled to a second power source terminal, and a second electrode of the sixth transistor is coupled to a fourth node;

a gate electrode of the seventh transistor is coupled to the third node, a first electrode of the seventh transistor is coupled to the first power source terminal, and a second electrode of the seventh transistor is coupled to the fourth node;

a gate electrode of the eighth transistor is coupled to the third node, a first electrode of the eighth transistor is coupled to the second power source terminal, and a second electrode of the eighth transistor is coupled to the output signal terminal;

a gate electrode of the ninth transistor is coupled to the third node, a first electrode of the ninth transistor is coupled to a second electrode of the tenth transistor, and a second electrode of the ninth transistor is coupled to the output signal terminal;

a gate electrode of the tenth transistor is coupled to a second electrode of the eleventh transistor and a second electrode of the twelfth transistor, respectively, and a first electrode of the tenth transistor is coupled to the first power source terminal;

a gate electrode of the eleventh transistor is coupled to the fourth node, and a first electrode of the eleventh transistor is coupled to the second power source terminal;

a gate electrode of the twelfth transistor is coupled to the fourth node, and a first electrode of the twelfth transistor is coupled to a second electrode of the thirteenth transistor; and a gate electrode of the thirteenth transistor is coupled to the output signal terminal, and a first electrode of the thirteenth transistor is coupled to the first power source terminal; wherein, the first electrode and the second electrode are one of a source electrode and a drain electrode, respectively.

10. The shift register unit according to claim 8, wherein the output sub-circuit comprises: a fourth inverter;

wherein an input terminal of the fourth inverter is coupled to the third node, and an output terminal of the fourth inverter is coupled to the output signal terminal.

11. The shift register unit according to claim 8, wherein the control sub-circuit comprises: a third inverter and a fourth transmission gate;

wherein an input terminal of the third inverter is coupled to the second node, and an output terminal of the third inverter is coupled to a second control terminal of the fourth transmission gate; and a first control terminal of the fourth transmission gate is coupled to the second node, an input terminal of the fourth transmission gate is coupled to the second node, and an output terminal of the fourth transmission gate is coupled to the third node.

12. The shift register unit according to claim 8, wherein the control sub-circuit comprises: a third inverter, a second transistor, a third transistor, a fourth transistor and a fifth transistor, wherein the second transistor and the third transistor have the same polarity, the fourth transistor and the fifth transistor have the same polarity, and the second transistor and the fourth transistor have opposite polarities;

an input terminal of the third inverter is coupled to the second node, and an output terminal of the third inverter is coupled to a gate electrode of the fifth transistor;

a gate electrode of the second transistor is coupled to the third node, a first electrode of the second transistor is coupled to a second electrode of the fourth transistor, and a second electrode of the second transistor is coupled to a second power source terminal;

a gate electrode of the third transistor is coupled to the second electrode of the fourth transistor, a first electrode of the third transistor is coupled to the second power source terminal, and a second electrode of the third transistor is coupled to the third node;

a gate electrode of the fourth transistor is coupled to the second node, and a first electrode of the fourth transistor is coupled to the first power source terminal; and a first electrode of the fifth transistor is coupled to the third node, and a second electrode of the fifth transistor is coupled to the first power source terminal; wherein, the first electrode and the second electrode are one of a source electrode and a drain electrode, respectively.

13. The shift register unit according to claim 12, wherein the second transistor and the third transistor are P-type transistors, and the fourth transistor and the fifth transistor are N-type transistors.

14. A driving method for a shift register unit, wherein the shift register unit comprises: an input circuit, a transmission circuit and an output control circuit;

wherein the input circuit is coupled to an input signal terminal, a first control signal terminal, a second control signal terminal, a first node and a second node, respectively, the transmission circuit is coupled to the first node, the second node, a clock signal terminal and a first power source terminal, respectively, and the output control circuit is coupled to the second node and an output signal terminal respectively; the driving method comprises:

an input phase, during which an electric potential of an input signal input by the input signal terminal is a first electric potential, and an electric potential of a clock signal input by the clock signal terminal is a second electric potential, controlling, by the input circuit, an electric potential of the first node to be a second electric potential, controlling, by the transmission circuit, an electric potential of the second node to be a first electric potential under the control of the first node and the clock signal, and controlling, by the output control circuit, an electric potential of the output signal terminal to be a second electric potential under the control of the second node;

an output phase, during which the electric potential of the input signal is a second electric potential, and the electric potential of the clock signal is a first electric potential, controlling, by the input circuit, an electric potential of the first node to be a second electric potential, controlling, by the transmission circuit, an electric potential of the second node to be a second electric potential under the control of the first node and the clock signal, and controlling, by the output control circuit, an electric potential of the output signal terminal to be a first electric potential under the control of the second node; and, a first reset phase, during which the electric potential of the input signal is a second electric potential, controlling, by the input circuit, an electric potential of the first node to be a first electric potential under the control of the input signal and the second node, controlling, by the transmission circuit, an electric potential of the second node to be a first electric potential under the control of the first node, and controlling, by the output control circuit, an electric potential of the output signal terminal to be a second electric potential under the control of the second node, wherein the transmission circuit comprises: a first inverter, a third transmission gate, a first transistor, and a second inverter;

during the input phase, the electric potential of the first node is a second electric potential, the electric potential of the clock signal is a second electric potential, the first transistor is turned off, the first inverter controls an electric potential of a first control terminal of the third transmission gate to be a first electric potential, the third transmission gate is turned on, the clock signal terminal outputs a clock signal at a second electric potential to an input terminal of the second inverter, and the second inverter controls the electric potential of the second node to be a first electric potential;

during the output phase, the electric potential of the first node is a second electric potential, the electric potential of the clock signal is a first electric potential, the first transistor is turned off, the first inverter controls the electric potential of the first control terminal of the third transmission gate to be a first electric potential, the third transmission gate is turned on, the clock signal terminal outputs a clock signal at a first electric potential to the input terminal of the second inverter, and the second inverter controls the electric potential of the second node to be a second electric potential; and during the first reset phase, the electric potential of the first node is a first electric potential, the first transistor is turned on, the first inverter controls the electric potential of the first control terminal of the third transmission gate to be a second electric potential, the third transmission gate is turned off, the first transistor outputs a second power source signal at a second electric potential to the input terminal of the second inverter, and the second inverter controls the electric potential of the second node to be a first electric potential.

15. The method according to claim 14, wherein the output control circuit comprises: a control sub-circuit and an output sub-circuit;

during the input phase and the first reset phase, the electric potential of the second node is a first electric potential, the control sub-circuit controls the electric potential of a third node to be a first electric potential under the control of the second node, and the output sub-circuit controls the electric potential of the output signal terminal to be a second electric potential under the control of the third node; and during the output phase, the electric potential of the second node is a second electric potential, the control sub-circuit controls the electric potential of the third node to be a second electric potential under the control of the second node, and the output sub-circuit controls the electric potential of the output signal terminal to be a first electric potential under the control of the third node.

16. The method according to claim 14, wherein the shift register unit further comprises: a reset circuit; the driving method further comprises:
- a second reset phase, during which an electric potential of a reset signal input by a reset signal terminal is a first electric potential, controlling, by the reset circuit, the electric potential of the first node to be a first electric potential, controlling, by the transmission circuit, the electric potential of the second node to be a first electric potential under the control of the first node, and controlling, by the output control circuit, an electric potential of the output signal terminal to be a second electric potential under the control of the second node.

17. A gate driving circuit, comprising: at least two cascaded shift register units, wherein the shift register unit comprises: an input circuit, a transmission circuit and an output control circuit;
- wherein the input circuit is coupled to an input signal terminal, a first control signal terminal, a second control signal terminal, a first node and a second node, respectively, and is configured to control an electric potential of the first node under the control of the input signal terminal, the first control signal terminal, the second control signal terminal and the second node;
- the transmission circuit is coupled to the first node, the second node, a clock signal terminal and a first power source terminal, respectively, and is configured to control an electric potential of the second node under the control of the first node, the clock signal terminal and the first power source terminal; and
- the output control circuit is coupled to the second node and an output signal terminal respectively, and is configured to control an electric potential of the output signal terminal under the control of the second node, and
- wherein the input circuit comprises: a first transmission gate and a NOR gate;
- a first control terminal of the first transmission gate is coupled to the first control signal terminal, a second control terminal of the first transmission gate is coupled to the second control signal terminal, an input terminal of the first transmission gate is coupled to the input signal terminal, and an output terminal of the first transmission gate is coupled to a first input terminal of the NOR gate; and
- a second input terminal of the NOR gate is coupled to the second node, and an output terminal of the NOR gate is coupled to the first node.

18. A display apparatus, comprising: the gate driving circuit according to claim 17.

* * * * *